United States Patent [19]
Kim

[11] Patent Number: 5,325,369
[45] Date of Patent: Jun. 28, 1994

[54] SEMICONDUCTOR DEVICE WITH AN ERROR DETECTING AND DISPLAYING CIRCUIT

[76] Inventor: Deok W. Kim, 3-307 Yuwon-1 Apt., Dangsan-Dong, Youngdeungpo-Gu, Seoul, Rep. of Korea

[21] Appl. No.: 711,945

[22] Filed: Jun. 7, 1991

[30] Foreign Application Priority Data

May 15, 1991 [KR] Rep. of Korea ............... 91-7824

[51] Int. Cl.$^5$ ............................................. G01R 31/28
[52] U.S. Cl. .................................... 371/29.1; 371/25.1
[58] Field of Search ............... 371/29.1, 16.5, 25.1, 371/28, 15.1; 307/441

[56] References Cited

U.S. PATENT DOCUMENTS

| | | | |
|---|---|---|---|
| 4,481,628 | 11/1984 | Pasquinelli | 371/28 |
| 4,654,850 | 3/1987 | Rodrigues et al. | 371/25.1 |
| 4,893,072 | 1/1990 | Matsumoto | 371/25.1 X |
| 4,942,576 | 7/1990 | Busack et al. | 371/25.1 X |
| 4,985,901 | 1/1991 | Cohen et al. | 371/28 X |
| 5,218,606 | 6/1993 | Eguchi et al. | 371/25.1 X |

*Primary Examiner*—Kevin J. Teska
*Attorney, Agent, or Firm*—Foley & Lardner

[57] ABSTRACT

A semiconductor device with an error detecting and displaying circuit included in the device for detecting whether or not a semiconductor unit within the device has a predetermined output according to a given input value, and for displaying the outputted results indicating an error state of the device. The error detecting and displaying circuit for a semiconductor unit having an input circuit, a logic processing circuit and an output circuit comprises an additional logic processing circuit connected to the semiconductor unit for logically operating logic signals sent from said semiconductor device. A comparison circuit is also connected both to the additional logic processing circuit and to the output circuit of said semiconductor unit for comparing signals from the additional logic processing circuit with signals from the output circuit to thereby output the compared results. A driver is connected to the comparison circuit for producing an enabling signal depending upon the compared results applied from the comparison circuit. A display is connected to the driver for indicating whether an error occurred in the semiconductor unit, depending upon the enabling signal sent from the driver.

12 Claims, 3 Drawing Sheets

SEMICONDUCTOR DEVICE WITH AN ERROR DETECTING AND DISPLAYING CIRCUIT

BACKGROUND OF INVENTION

1. Field of the Invention

The invention relates to a semiconductor device with an error detecting and displaying circuit, and more particularly, to a semiconductor device with an included error detecting and displaying circuit for detecting and displaying an error state when an error occurs in the semiconductor device.

2. Description of Prior Art

Generally, various types of digital devices may be utilized for a predetermined purpose in the industrial field either by processing a logical operation or by storing a binary number. A digital device, for example, a counter storage means (for example, memory device or register), D/A converter, A/D converter, programmable logic device or microprocessor, and the like, are manufactured into a single integrated circuit package.

Therefore, many types of single systems, for example a computer system or a communication system, are manufactured by electrically connecting a plurality of such single packages to each other according to a desired circuit design. However, if an error occurs in the present completed system, there is a problem in that it is difficult for the maintenance and repair of the system, since each package of all the packages which make up the system should be checked to locate the problem, i.e. the location of the error. Furthermore, if a system is composed of several hundred packages, it is a burden to check each package in view of the time required.

SUMMARY OF THE INVENTION

Therefore, it is an object of the present invention to solve the problem set forth above and to provide a semiconductor device with an error detecting and displaying circuit included in the device for detecting whether or not a semiconductor unit within the device has a predetermined output according to a given input value, and for displaying the outputted results indicating an error state of the device.

A further object of the present invention is to provide a semiconductor device having an error detecting and displaying means manufactured into a single integrated circuit package.

A further object of the present invention is to provide a semiconductor device with an error detecting and displaying circuit which is inexpensive to manufacture.

The preceding objects should be construed as merely presenting the more pertinent features and applications of the invention. Many other beneficial results can be obtained by applying the disclosed invention in a different manner or modifying the invention within the scope of the disclosure. Accordingly, other objects and a fuller understanding of the invention may be had by referring to the Invention and the Detailed Description, below, which describe the preferred embodiments in addition to the scope of the invention defined by the claims considered in conjunction with the accompanying drawings.

The semiconductor device with an error detection and displaying means according to the present invention is defined by the claims with a specific embodiment shown in the attached drawings. For the purpose of summarizing the present invention, it relates to a semiconductor device with an error detecting and displaying circuit which comprises a semiconductor unit with an input circuit for logically processing inputted signals to output logic signals, a logic processing circuit for logically operating on the logic signals for a predetermined purpose, and an output circuit for outputting the logically operated signal from the logic processing circuit. An additional logic processing circuit is connected to the semiconductor unit for logically processing logic signals sent from the semiconductor unit. A comparison circuit is connected to both the additional logic operational circuit and the output circuit of the semiconductor unit for comparing signals from the additional logic operational circuit with signals from the output circuit to thereby output compared results. A driver, which may include a latch circuit, is connected to the comparison circuit for producing an enabling signal depending upon said compared results applied from the comparison circuit. A display, such as a diode LED or a test terminal, is connected to the driver and indicates whether an error has occurred in the semiconductor unit, depending upon the enabling signal sent from the driver.

The additional logic processing circuit of the error detecting and display circuit may be connected to the input circuit of the semiconductor unit (first embodiment) or to the logic processing circuit (second embodiment) of the semiconductor unit.

Preferably, the comparison circuit is an exclusive OR gate.

The semiconductor unit and the error detecting and displaying means are preferably manufactured in a single integrated circuit package.

In a third embodiment of the invention, the error detecting and displaying circuit detects whether or not an error has occurred in a semiconductor unit and displays the error state so detected. However, in this embodiment the additional logic processing circuit is not used. The semiconductor unit has an input circuit for logically processing inputted signals to output logic signals, a logic processing circuit for logically operating on the logic signals for a predetermined purpose, and an output circuit to receive an input signal IS sent from the logic processing circuit and to produce output signal OS.

The error detecting and displaying means in this embodiment comprises a comparison circuit connected to the output circuit for comparing the input signal IS applied from the logic processing circuit with an output signal OS outputted from the output, to thereby output a compared result. A driver, which may further include a latch circuit is connected to the comparison circuit and produces an enabling signal depending upon the compared result applied from the comparison circuit. A display, such as a diode LED or a test terminal, is connected from the driver indicates whether an error has occurred in the semiconductor unit, depending upon the enabling signal sent from the driver.

Preferably, the comparison circuit is an exclusive OR gate.

The semiconductor unit and the error detecting and displaying means are preferably manufactured into a single integrated circuit package.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiments disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

Similar reference characters refer to similar parts throughout the several views of the drawings.

DETAILED DESCRIPTION OF THE INVENTION

Figure 1:
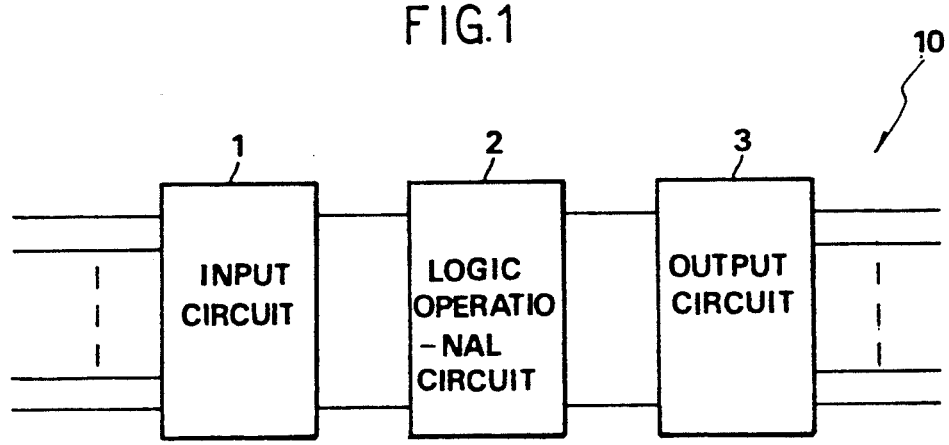
FIG. 1 illustrates a block diagram showing a prior art semiconductor unit with a plurality of logic circuits.

FIG. 1 represents a prior art semiconductor unit 10 in which an input circuit 1, a logic processing circuit 2 and an output circuit 3 are formed.

The input circuit 1 receives a predetermined electrical signal for processing (for example, inverting or delaying) the inputted electrical signal and transfers the processed signal to the logic processing circuit 2. The logic processing circuit 2 logically operates the signal transferred from the input circuit 1 and transfers the logically operated signal to the output circuit 3. At the output circuit 3, the signal transferred from the logic processing circuit 2 is properly processed (for example, inverted, delayed or buffered), and then outputted. However, if an error occurs either in the logical processing circuit 2 or in the output circuit 3, there are no means to detect the error in the prior art semiconductor unit.

Figure 2:
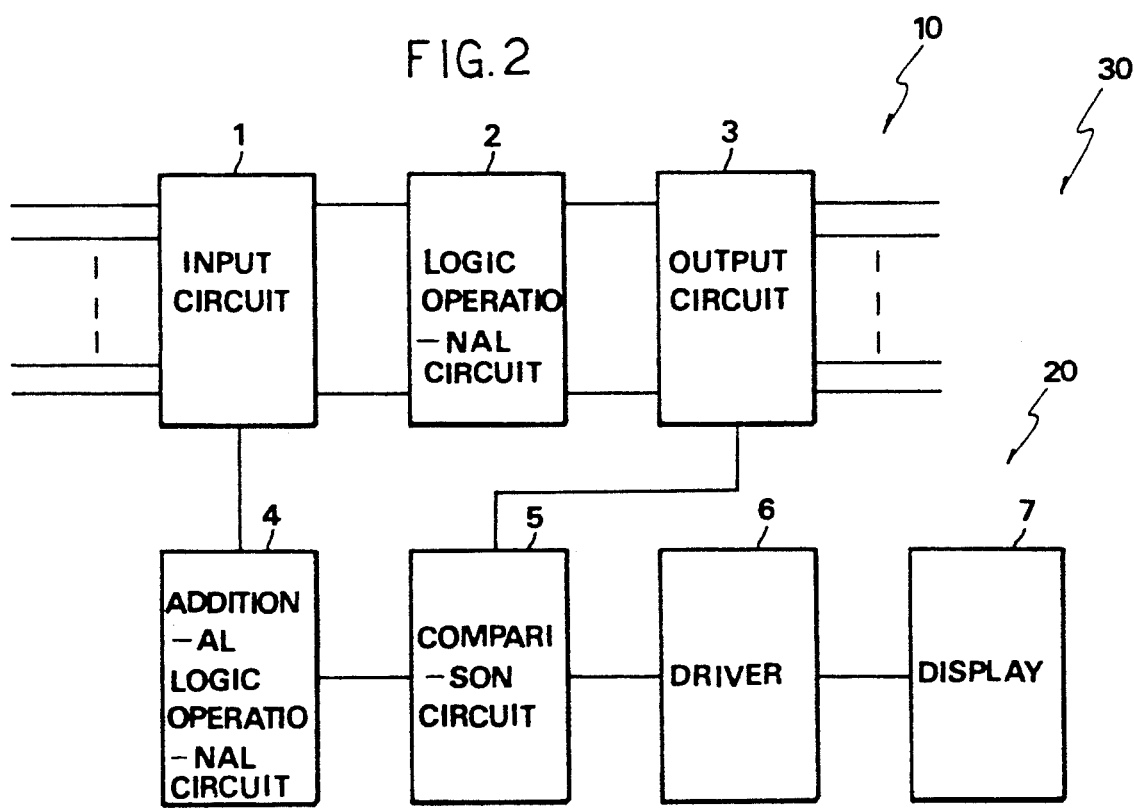
FIG. 2 illustrates a block diagram showing a semiconductor device including an error detecting and displaying circuit manufactured into a single package according to the first embodiment of the present invention.

FIG. 2 illustrates a block diagram of a semiconductor device 30 which includes an error detecting and displaying circuit 20, according to the first embodiment of the invention, to detect whether or not an error occurred in the semiconductor unit 10.

The input circuit 1 of the semiconductor unit 10 is connected to an output circuit 3 through a logic processing circuit 2 and to an additional logic processing circuit 4 of the error detecting and displaying circuit 20. The output circuit 3 is then connected to a comparison circuit 5 which is connected through a driver 6 to a display.

The operation of the first embodiment of the present invention of FIG. 2 is described as follows. As described in connection with FIG. 1, the signal from the input circuit 1 is transferred, through the logic processing circuit 2 where the signal is logically processed, to the output circuit 3. The signal outputted from the output circuit 3 is then transferred to the comparison circuit 5 of the error detecting and displaying circuit 20. In the mean time, the signal from the input circuit 1 is also transferred, through the additional logic processing circuit 4 where the signal is logically processed, to the comparison circuit 5 of the error detecting and displaying circuit 20. The comparison circuit 5 compares the signal outputted from the additional logic processing circuit 4, of the error detecting and displaying circuit 20, with the signal outputted from the output circuit 3 of the semiconductor unit 10, and transfers the compared results to the driver 6. At the driver 6, an enabling signal is produced which enables the display to display whether or not an error occurred at the semiconductor unit 10, depending upon the resulting signal transferred from the comparison circuit 5. The display, which comprises a diode LED, displays the error state of the semiconductor unit 10, depending upon the enabling signal transferred from the driver 6.

Therefore, if the logic processing circuit 2 is, for example, disabled in its given purpose, the error state thereof may be displayed through the display according to the invention. It is also noted that, though it is not shown in the drawing, a latch circuit may be added in the driver 6 to latch the output signal from the comparison circuit 5, and, instead of the LED, the display can utilize a test terminal which can be tested by utilizing a tester apparatus or the like.

Figure 3:
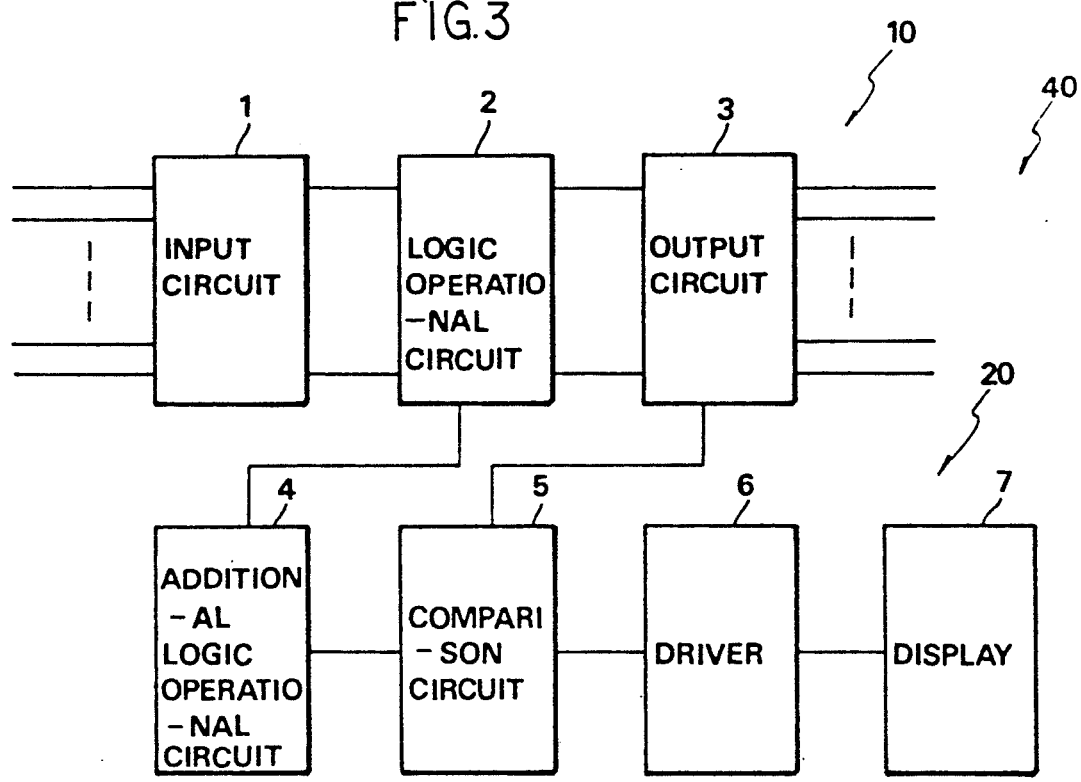
FIG. 3 illustrates a block diagram showing a semiconductor device including an error detecting and displaying circuit manufactured into a single package according to the second embodiment of the present invention.

FIG. 3 illustrates a block diagram showing semiconductor device 40 with an error detecting and displaying circuit 20 manufactured into a single package according to the second embodiment of the present invention. An input circuit 1 of the semiconductor unit 10 is connected through a logic processing circuit 2 to an output circuit 3. The logic processing circuit 2 is connected through an additional logic processing circuit 4 to a comparison circuit 5 of the error detecting and displaying circuit 20. The output circuit 3 is also connected to the comparison circuit 5. The comparison circuit 5 is then connected, through a driver 6, to a display.

The operation of the second embodiment of the present invention of FIG. 3 is described as follows. The signal from the input circuit 1 is transferred to the logic operational circuit 2 for logically processing the transferred signal. The logically processed signal from the logic processing circuit 2 is then transferred both to the output circuit 3 and to the additional logic processing circuit 4 for logically processing the signal. At the comparison circuit 5, the signal from the additional logic operational circuit 4 is then compared with the signal from the output circuit 3, and the compared results are outputted to the driver 6. At the driver 6, an enabling signal is produced depending upon the resulting signal from the comparison circuit 5. The enabling signal is then transferred to the display 7 to indicate whether or not an error has occurred at the semiconductor unit 10.

Figure 4:
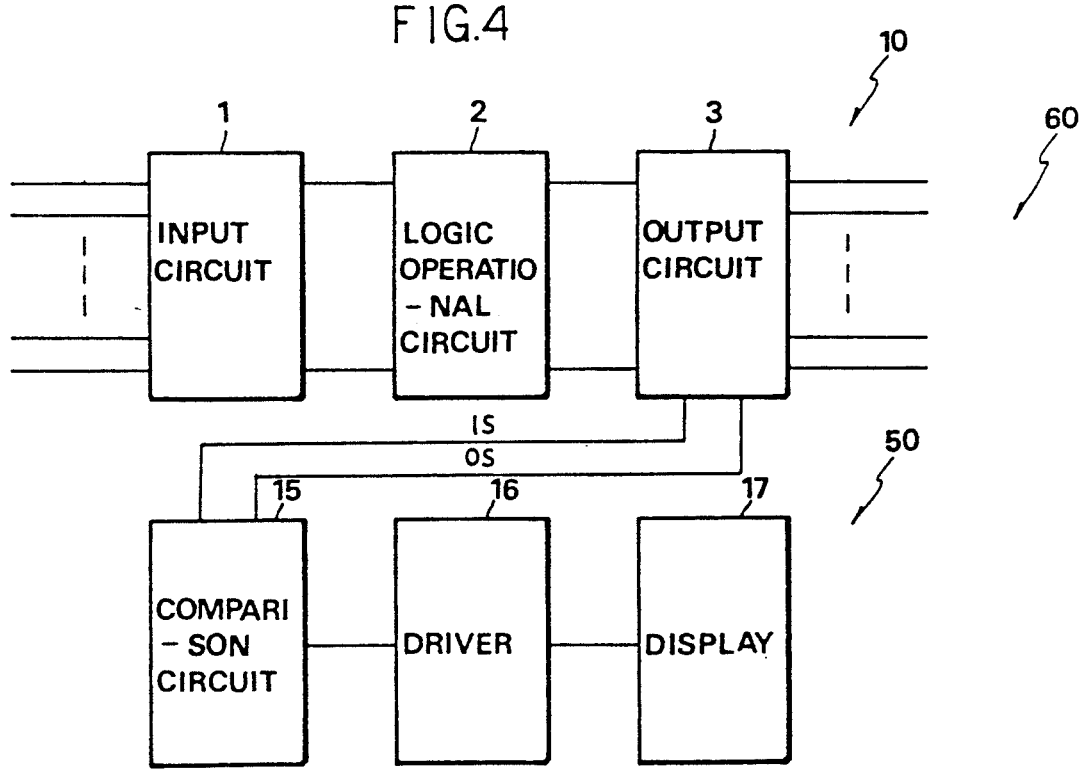
FIG. 4 illustrates a block diagram showing a semiconductor device including an error detecting and displaying circuit manufactured into a single package according to the third embodiment of the present invention; and, FIG. 5 illustrates an odd parity detector to which the first embodiment of the present invention of FIG. 2 is applied.

FIG. 4 illustrates a block diagram showing a resulting semiconductor device 60 including an error detecting and displaying circuit 50 manufactured into a single integrated circuit package according to third embodiment of the invention. An input circuit 1 of the semiconductor unit 10 is connected through a logic processing circuit 2 to an output circuit 3. The output circuit 3 is then connected to a comparison circuit 15 to supply both the input signal IS, which is inputted to the output circuit 3 from the logic processing circuit 2, and the output signal OS which is outputted from the output circuit 3. The comparison circuit 15 is connected through a driver 16 to a display 7.

The operation of above mentioned structure is described as follows. The signal from the input circuit 1 is transferred to the logic processing circuit 2 to logically process the transferred signal. The logically processed signal from the logic processing circuit 2, that is the input signal IS, is then transferred to the output circuit 3 for proper processing (for example, inverting, delaying or buffering) to thereby output the signal OS which is properly signal-processed in a given purpose. At the comparison circuit 15, the input signal IS inputted to the output circuit 3 from the logic processing circuit 2 is compared with the output signal OS. The compared result from the comparison circuit 15 is then transmitted to the driver 16 for producing an enabling signal. The enabling signal is then transferred to the display 17 to indicate whether an error has occurred at the semiconductor unit 10 or not. As described above, it can be readily appreciated whether or not an error has occurred in the semiconductor unit according to the present invention.

Figure 5:
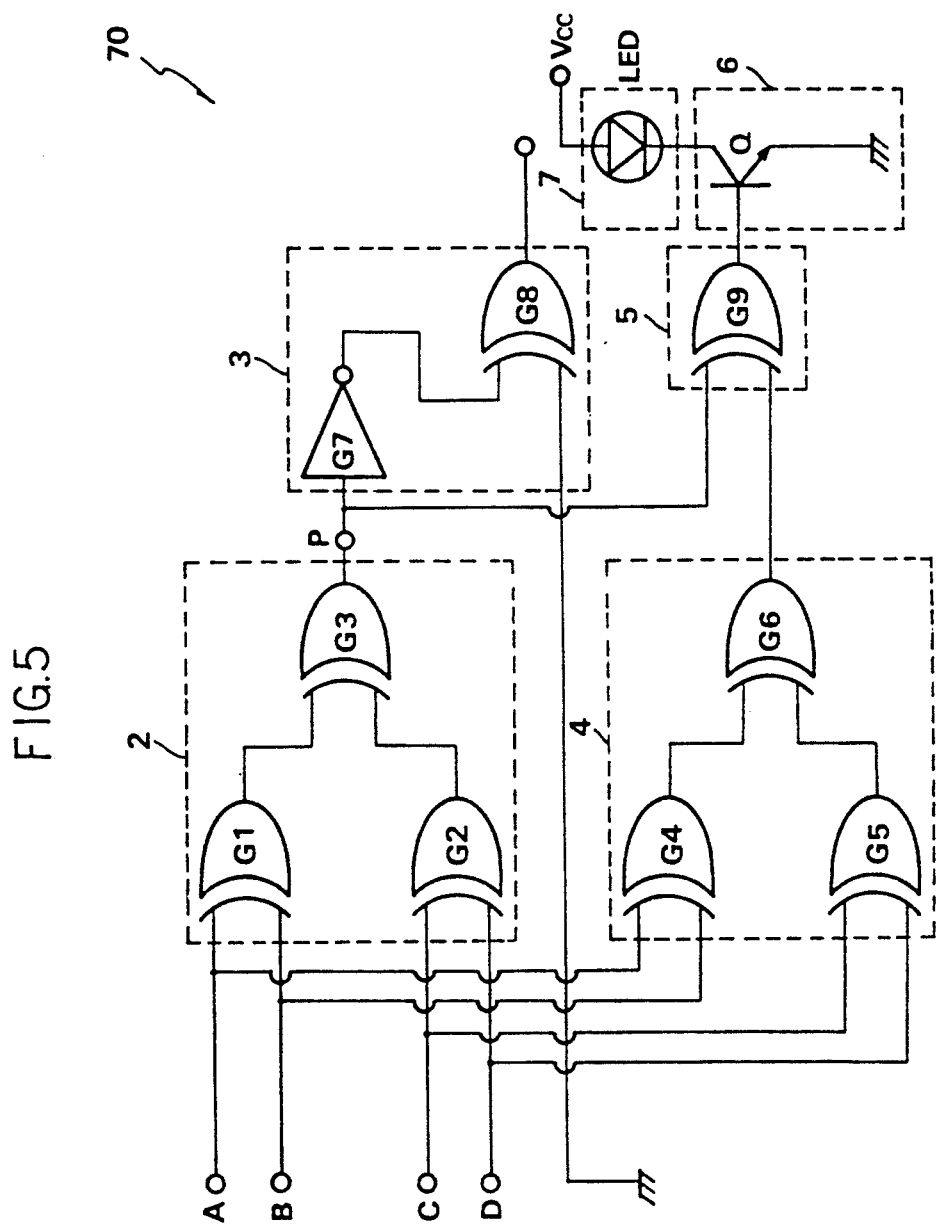

FIG. 5 illustrates a package 70 of the odd parity detector to which the first embodiment of the present invention of FIG. 2 is applied thereto, in order to assist in the understanding of the present invention.

Assuming that, in FIG. 5, parity inputs A, B, C and D of the input circuit 1 are at a high level state, the outputs of the exclusive OR gates G1, G2 of the logic processing circuit 2 are at a low level state, so that the output of the exclusive OR gate G3 becomes a low level state. Since the output of the exclusive OR gate G3 is in a low level state, the output of the inverting gate G7 of the output circuit 3 becomes a high level state and the output of the exclusive OR gate G8 becomes a high level state as shown in the drawing. Therefore, it is proved that the parity inputs are an even parity. Conversely, if the output of the exclusive OR gate G8 is at a low level state, it is proved as an odd parity.

However, if either all of the exclusive OR gates G1, G2 and G3 are disabled or anyone of them is disabled, the output of the exclusive OR gate G3, that is, the point P becomes a high level state rather than a low level state. (It is assumed that the parity inputs A, B, C and D are in a high level state.) Therefore, the outputs of the exclusive OR gate G4, G5 of the additional logic processing circuit 4, which has the same structure as that of the logic processing circuit 2, become a low level state, respectively, so that the output of the exclusive OR gate G6 becomes a low level state. Accordingly, the output of the exclusive OR gate G9 of the comparison circuit 5 becomes a high level state, since the output of the exclusive OR gate G3 is in a high level state and the output of the exclusive OR gate G6 is in a low level state, respectively. Therefore, transistor Q of the driver 6 turns on, so that the diode LED turns on, depending upon the supply voltage Vcc applied thereto. Subsequently, if the diode LED turns on, it can be easily seen that there is a problem in the package 70 of the odd parity detector.

As described above, although a system is constituted by several hundreds of the packages, it is easy to check whether there is a problem in a package or not, without checking each one.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A single package integrated circuit semiconductor unit, comprising:
   an input circuit for receiving and logically processing inputted signals to obtain output logic signals;
   a first logic processing circuit for logically operating a predetermined function on the output logic signals; and
   an output circuit for outputting said logically processed signals from said first logic processing circuit, wherein said semiconductor unit further includes an error detecting and displaying circuit comprising:
   a second logic processing circuit operatively connected to said input circuit, for receiving said inputted signals in said integrated circuit semiconductor unit, and connected to said first logic processing circuit, for receiving signals logically processed by said first logic processing circuit;
   a comparison circuit, connected both to said second logic processing circuit and said output circuit in said integrated circuit semiconductor unit, for comparing signals provided from said second logic processing circuit with signals provided from said output circuit and outputting the compared results;
   a driver connected to said comparison circuit for producing an enabling signal based upon the compared results provided by said comparison circuit; and
   a display connected to said driver for indicating whether an error occurred in said integrated circuit semiconductor unit based upon said enabling signal provided by said driver.

2. The error detecting and displaying circuit of claim 1, wherein said second logic processing circuit is connected to said input circuit in said integrated circuit semiconductor unit.

3. The error detecting and displaying circuit of claim 1, wherein said second logic processing circuit is connected to said first logic processing circuit in said integrated circuit semiconductor unit.

4. The error detecting and displaying circuit of claim 1, wherein said comparison circuit is an exclusive OR gate.

5. The error detecting and displaying circuit of claim 1, wherein said driver further includes a latch circuit.

6. The error detecting and displaying circuit of claim 1, wherein said display is a LED.

7. The error detecting and displaying circuit of claim 1, wherein said display is a test terminal.

8. A single package integrated circuit semiconductor unit, comprising:
   an input circuit for logically processing inputted signals to obtain output logic signals; and
   a logic processing circuit for logically operating on said output logic signals to provide an input signal IS to an output circuit which receives and processes said input signal IS to produce an output signal OS for a predetermined function, wherein said semiconductor unit further includes an error detecting and displaying circuit for detecting whether or not an error has occurred in said integrated circuit semiconductor unit, said error detecting and displaying circuit comprising:

a comparison circuit connected to said output circuit for comparing said input signal IS supplied from said logic processing circuit with said output signal OS outputted from said output circuit to output a compared result;

a driver connected to said comparison circuit for producing an enabling signal based upon said compared results provided by said comparison circuit; and a display connected to said driver for indicating whether an error has occurred in said semiconductor unit based upon said enabling signal provided by said driver.

9. The error detecting and displaying circuit of claim 8, wherein said comparison circuit is an exclusive OR gate.

10. The error detecting and displaying circuit of claim 8, wherein said driver further includes a latch circuit.

11. The error detecting and displaying circuit of claim 8, wherein said display is a LED.

12. The error detecting and displaying circuit of claim 8, wherein said display is a test terminal.

* * * * *